United States Patent
Khan P et al.

(10) Patent No.: US 11,886,368 B2
(45) Date of Patent: Jan. 30, 2024

(54) CROSSOVER POINT CORRECTION OF DIFFERENTIAL SIGNAL

(71) Applicant: SEMICONDUCTOR COMPONENTS INDUSTRIES, LLC, Phoenix, AZ (US)

(72) Inventors: Athar Ali Khan P, Bangalore (IN); Saravanan Ganesh, Bengaluru (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/657,655

(22) Filed: Apr. 1, 2022

(65) Prior Publication Data
US 2023/0315663 A1   Oct. 5, 2023

(51) Int. Cl.
| | |
|---|---|
| *G06F 13/38* | (2006.01) |
| *G06F 13/40* | (2006.01) |
| *H03K 5/14* | (2014.01) |
| *H03K 5/15* | (2006.01) |
| *G06F 13/42* | (2006.01) |

(52) U.S. Cl.
CPC ........ *G06F 13/385* (2013.01); *G06F 13/4068* (2013.01); *G06F 13/4282* (2013.01); *H03K 5/14* (2013.01); *H03K 5/15006* (2013.01); *G06F 2213/0042* (2013.01)

(58) Field of Classification Search
CPC ................................................. G06K 19/07743
See application file for complete search history.

(56) References Cited

U.S. PATENT DOCUMENTS

| | | | |
|---|---|---|---|
| 7,173,453 B2 * | 2/2007 | Prather | H03K 19/018528 326/63 |
| 2007/0064778 A1 | 3/2007 | Lacy et al. | |
| 2020/0350899 A1* | 11/2020 | Huang | H03K 17/005 |

* cited by examiner

*Primary Examiner* — Henry Tsai
*Assistant Examiner* — Juanito C Borromeo
(74) *Attorney, Agent, or Firm* — Polansky & Associates, P.L.L.C.; Paul J. Polansky; Nathan H. Calvert (57) ABSTRACT

A repeater circuit includes at least a first input, and output, and a repeater. The first input for receiving a single-ended data signal from an embedded universal serial bus (eUSB) host. The output provides a differential data signal in a differential universal serial bus (USB) format. The repeater is coupled between the first input and output for converting the single-ended data signal to a differential data signal, the repeater includes an adaptive delay element operable for both sides of the differential data signal to delay one, but not both, of a rising edge and a falling edge of the differential data signal in order to meet a crossover specification for the USB format.

20 Claims, 6 Drawing Sheets

CROSSOVER POINT CORRECTION OF DIFFERENTIAL SIGNAL

FIELD OF THE INVENTION

This disclosure relates generally to electronic communication, and more particularly, to signaling over communication links such as Universal Serial Bus (USB) links.

BACKGROUND

The embedded universal serial bus 2.0 standard, known as eUSB2 or simply eUSB, is a physical layer supplement to the USB 2.0 specification that was developed to address the need for a low voltage USB 2.0 physical layer (PHY) solutions for embedded applications. As technology nodes for system-on-chips (SOCs) in laptops, smartphones, and tables became smaller, it became more difficult to support 3.3 volt input/output cells required for legacy USB signaling. The eUSB 2.0 standard drops signaling levels to 1.2 volts or lower, and provides enhancements to optimize power efficiency. eUSB is capable of supporting USB high speed, full speed, and low speed operation. The standard provides for two main operational modes, native mode and repeater mode.

The repeater mode, which is used for backward compatibility with legacy signaling speeds of USB 2.0, introduces a repeater device as an interface device between legacy and new generation devices. Repeaters are voltage level translators between host/peripheral SOC and legacy USB 2.0 peripheral/host devices.

There are some difficulties in designing such repeaters for high volume, low cost production. The legacy USB host and sink interface employs a differential to differential data transfer. However, with the eUSB standard, the embedded device provides a single-ended data signal for interfacing with legacy devices through a repeater, which converts it to a differential data signal. This differential data signal must meet the signaling specifications of the legacy USB2.0 standard. One particular signaling specification that has been difficult to meet with a low-cost repeater circuit is the crossover point. This crossover point specification should be met at both supported signaling speeds, 1.5 Mbps and 12 Mbps.

One known solution employs multiple output stages connected in parallel to the output terminal of the repeater. By sequentially providing the USB data, this solution activates stages sequentially to control the rise time and fall time of the signal. However, this solution is relatively complicated and expensive. Another known solution is to include a resistor-capacitor (RC) network at the output of the driver. However, this solution has difficulty adjusting to the different speeds required. Furthermore, such solutions will typically need extensive redesign in order to be used with newer, faster standards as the further updates to the USB standard are developed.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 1:
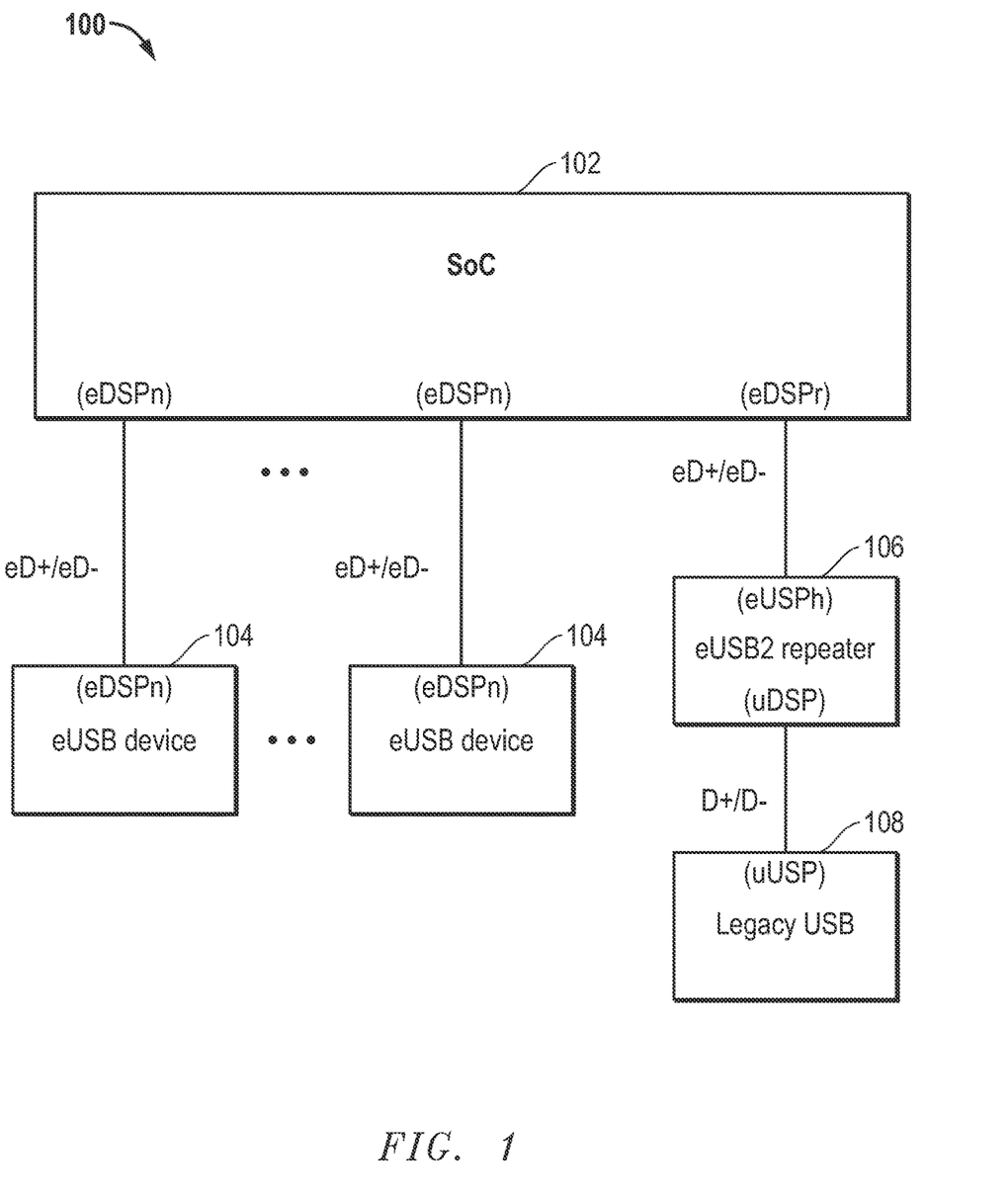
FIG. 1 illustrates in block diagram form an eUSB system including a repeater for interfacing with legacy devices according to some embodiments.

FIG. 1 illustrates in block diagram form an eUSB system 100 including a repeater for interfacing with legacy devices according to some embodiments. System 100 includes a host system-on-chip (SOC) 102, two eUSB device controllers 104, an eUSB2 repeater 106, and a legacy USB device controller 108.

SOC 102 is the host/peripheral USB controller and signaling chip which is typically coupled into the host system either to a processor or to a data fabric connected to multiple processing clients or other communication clients which may require communication over USB. SOC 102 includes two downstream ports for the eUSB devices labeled "eDSPn", a downstream legacy port labeled "eDSPr", and one or more upstream ports for communicating with the host system (not shown).

Each eUSB device controller 104 includes an upstream port labeled "eUSPn", which is adapted to connect to SOC 102 over a differential eUSB link labeled "eD+/eD−", which is a 1.8V differential link in this example.

On the right is depicted eUSB2 repeater 106, which includes an upstream port labeled "eUSPh" and a legacy downstream port labeled "uDSP". The eUSPh port connects to SOC 102 over a link labeled "eD+/eD−", however this link is not employed in a normal differential signaling mode, but instead each side of the link is used for single-ended signaling depending on the mode of the link, as further discussed below. The uDSP port connects to legacy USB device 108 over a legacy USB differential link labeled "D+/D−", which are used herein to refer both to the terminals and to the signals on the terminal.

It is noted that while in this example, the repeater is located on the host device, an eUSB repeater may instead be used on the peripheral device to couple an eUSB compliant peripheral device to a legacy USB host controller.

Figure 2:
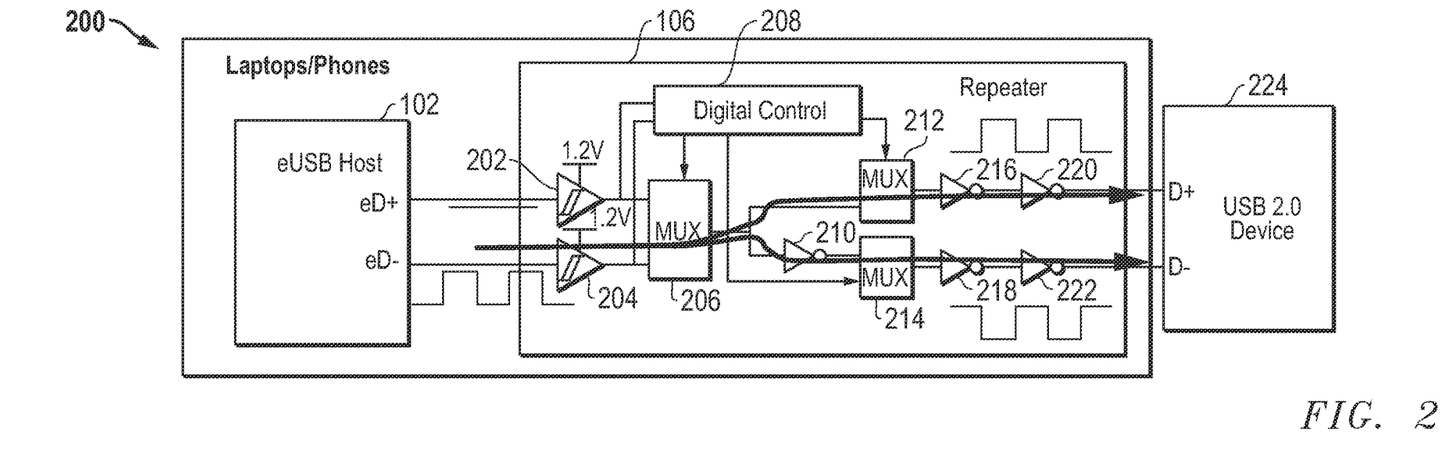
FIG. 2 illustrates in block diagram form a USB system illustrating its use in one signaling mode according to some embodiments.
Figure 3:
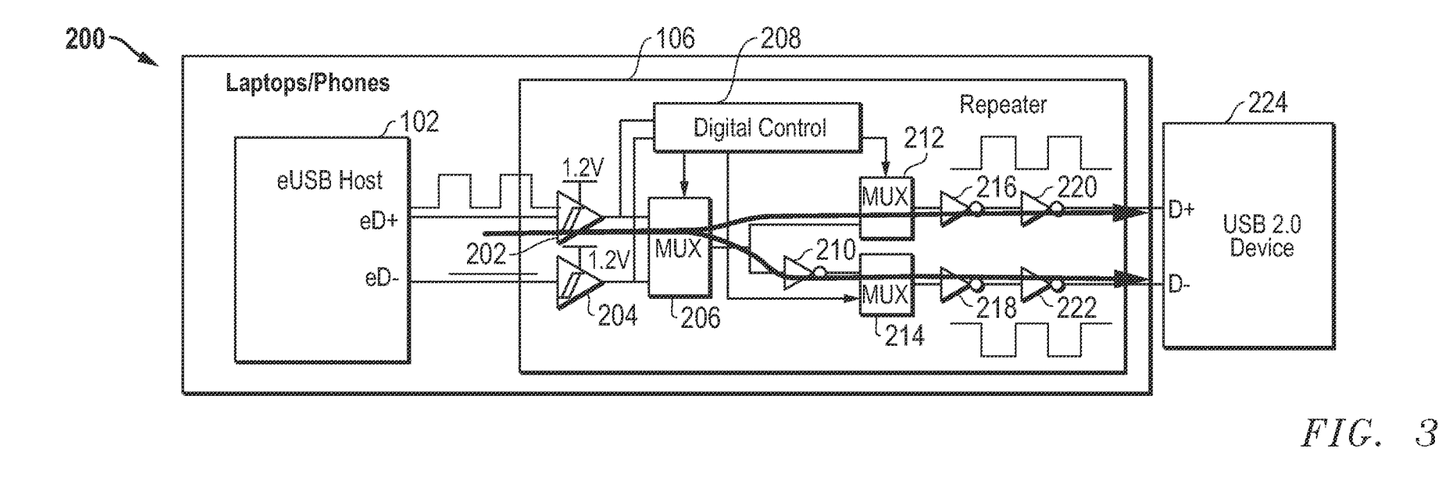
FIG. 3 illustrates in block diagram form the system of FIG. 2 illustrating its use in another signaling mode.

FIG. 2 illustrates in block diagram form a USB system 200 illustrating its use in one signaling mode according to some embodiments. FIG. 3 illustrates in block diagram form the system of FIG. 2 illustrating its use in another signaling mode. Referring to both FIG. 2 and FIG. 3, system 200 is an eUSB compliant signaling system including host device such as a laptop computer or a phone as shown, and a legacy USB device. System 200 includes an SOC 102 labeled "eUSB Host", a repeater 106, and legacy USB device 224, which in this example is a USB 2.0 device.

Repeater 106 has a first input/output terminal connected to an "eD+" differential signaling input/output of SOC 102, a second input/output terminal connected to an "eD−" differential signaling input/output of SOC 102, both part of the eUSPh port. On the downstream side, repeater 106 has a third input/output terminal adapted for connecting to a "D+" input/output of USB device 224, and a fourth input/output terminal adapted for connecting to the "D−" input/output of USB device 224, both part of the uDSP port. Repeater 106 includes a pair of receivers 202 and 204, a multiplexer 206, a digital control circuit 208, an inverter 210, a pair of multiplexers 212 and 214, a pair of inverters 216 and 218, and a pair of drivers or output buffers 220 and 222.

Receivers 202 and 204 are connected to the eD+ and eD− inputs of repeater 106. (It is also noted that because USB is uses bidirectional signaling, a pair of drivers, not shown, is also included at each port in the upstream direction, and a pair of receivers in the downstream direction.) Receivers 202 and 204 are supplied with a 1.2V supply as depicted, and the outputs of receivers 202 and 204 are both fed to multiplexer 206 and digital control circuit 208.

Multiplexer 206 has two inputs receiving the outputs of receivers 202 and 204, respectively, and an output connected to the input of inverter 210 and to the input of multiplexer 212. Digital control circuit 208 has two inputs connected to the outputs of receivers 202 and 204, a first output connected to control multiplexer 206, a second output connected to multiplexer 212, and a third output connected to multiplexer 214. Inverter 210 receives the output of multiplexer 206 and provides an inverted version of this signal to an input of multiplexer 214, while multiplexer 212 receives an un-inverted version. The outputs of multiplexers 212 and 214 provide un-inverted and inverted versions of the signal to inverters 216 and 218, respectively, which feed drivers 220 and 222. Drivers 220 and 222, in this implementation, are inverting drivers and operate on the higher voltage, typically 3.3V, for driving a differential signal to legacy USB device 224.

The arrows on FIG. 2 depict the operation for full speed (FS) mode communication from eUSB to USB, while the arrows on FIG. 3 depict the operation for low speed (LS) mode operation. As provided in the eUSB specification, for FS mode the eD− output of SOC 102 provides the data, while the eD+ output is held at a constant value, which is depicted by the signals shown along the eD+ and eD− connections of FIG. 2. In LS mode operation, the eD+ output of SOC 102 carries the signal, while the eD− output is held at a constant value, as depicted by the signals shown in FIG. 3. Digital control circuit 208 uses the output receivers 202 and 204 to detect the status of the eD+ and eD− the mode of operation. Responsive to detecting the mode of operation, digital control circuit 208 controls multiplexer 206 to select which input signal to pass to its output. Digital control circuit 208 also controls multiplexers 212 and 214 to implement control signaling for the USB protocol. In particular, multiplexers 212 and 214 operate to selectively pass either the D+ and D− signals, or USB handshake and control signals provided by digital control circuitry (not shown on the drawing for simplicity) during protocol negotiations such as speed control and link initialization.

With the correct input selected at multiplexer 206, the output of multiplexer 206 is used to create inverted and un-inverted versions of the signal for transmission to legacy USB device 224, as depicted by the signals along the driver output path to the D+ and D− connections.

For interfacing with legacy USB2.0 devices, the legacy USB1.1 data transfer rates for low speed (1.5 Mbps) and full speed (12 Mbps) are supported by using a repeater such as repeater 106. If either the USB host or sink is an eUSB device then the data transfer is single ended to differential as depicted for the case of an eUSB host and a legacy USB sink. Repeater 106 is used between eUSB and USB2.0 as an interface to convert the signals accordingly while meeting USB2.0 specs at the interface, including higher signaling voltages for communicating over external ports through USB cables.

Importantly, meeting the crossover specification of 1.3V to 2V at the USB2.0 interface is required for both speed modes. This is challenging to do with a single, low-cost driver circuit because there is a large difference in the specifications for rise time and fall time for LS mode (75 nS) and FS mode (4 nS).

Figure 4:
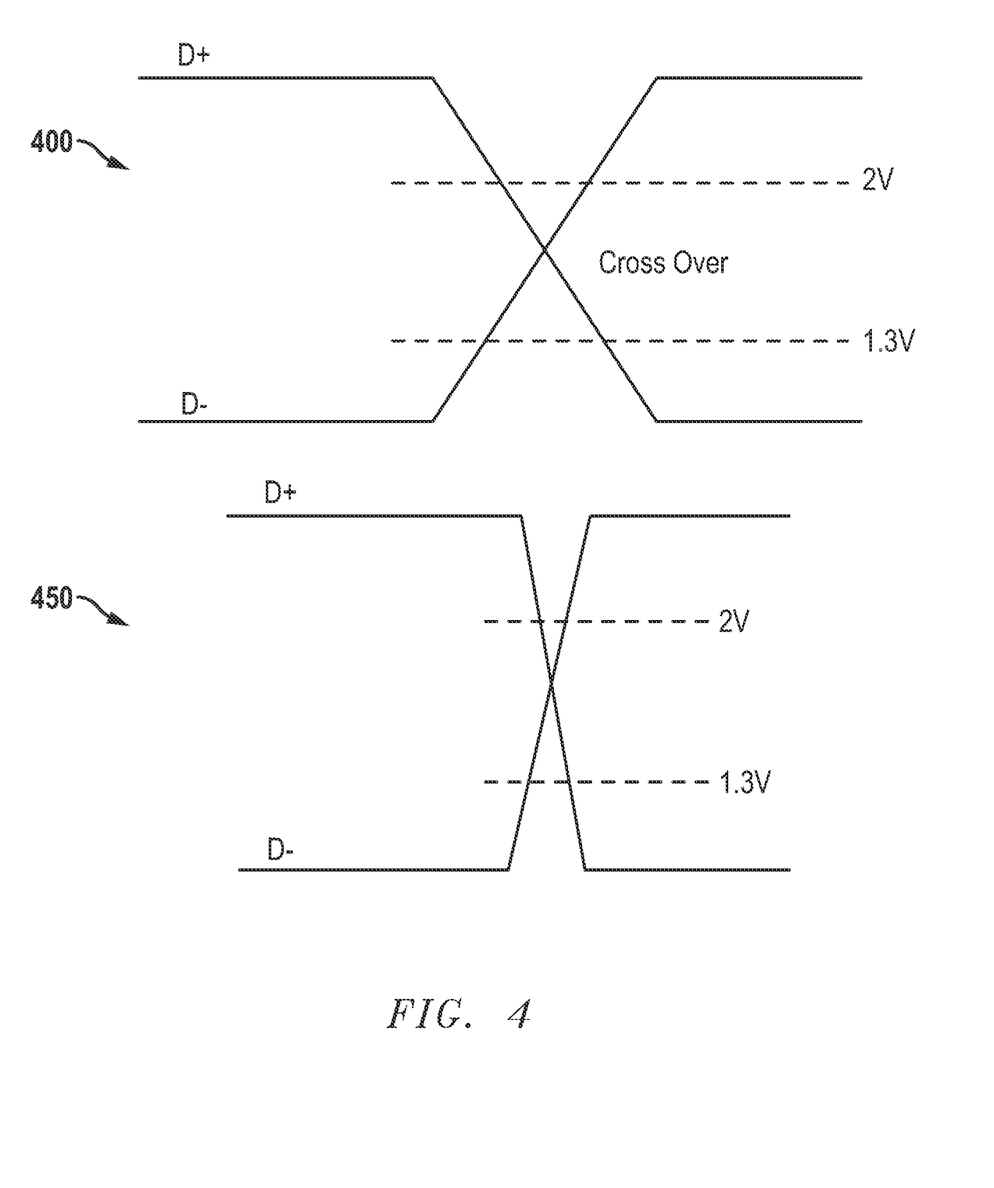
FIG. 4 illustrates in diagram form the crossover specification of two signaling modes.

FIG. 4 illustrates in diagram form the crossover specification of two signaling modes in diagrams 400 and 450. The vertical axis represents the signal level and horizontal axis represents time. The LS mode is depicted in diagram 400, which shows the D+ signal transitioning from high to low while the D− signal transitions from low to high. The relative rise and fall times of the signals are not shown to scale for illustration purposes. The crossover specification for USB 2.0 signaling requires the differential signal crossover point to be between 1.3V and 2V as depicted. The same crossover specification is required for FS mode as shown in diagram 450. Meeting this crossover specification for both modes across wide range of load conditions possible with USB 2.0 cables and board traces is challenging. In the FS mode, the expected load capacitance on the D+ and D− connections is 50 pF, while in the LS mode the load capacitance can vary from 200 pF to 600 pF. A simple output buffer (driver) designed to provide the typical 1.65V crossover for an average expected load in the LS mode (400 pF) will not meet the crossover specification across process, voltage, and temperature (PVT) variations and the very wide load and speed conditions required to support both LS mode and FS mode. However, the differential output path of repeater 106 includes features to meet the crossover specification across these various conditions while still providing a simple and cost-effective circuit design for high-volume low-cost eUSB systems.

Figure 5:
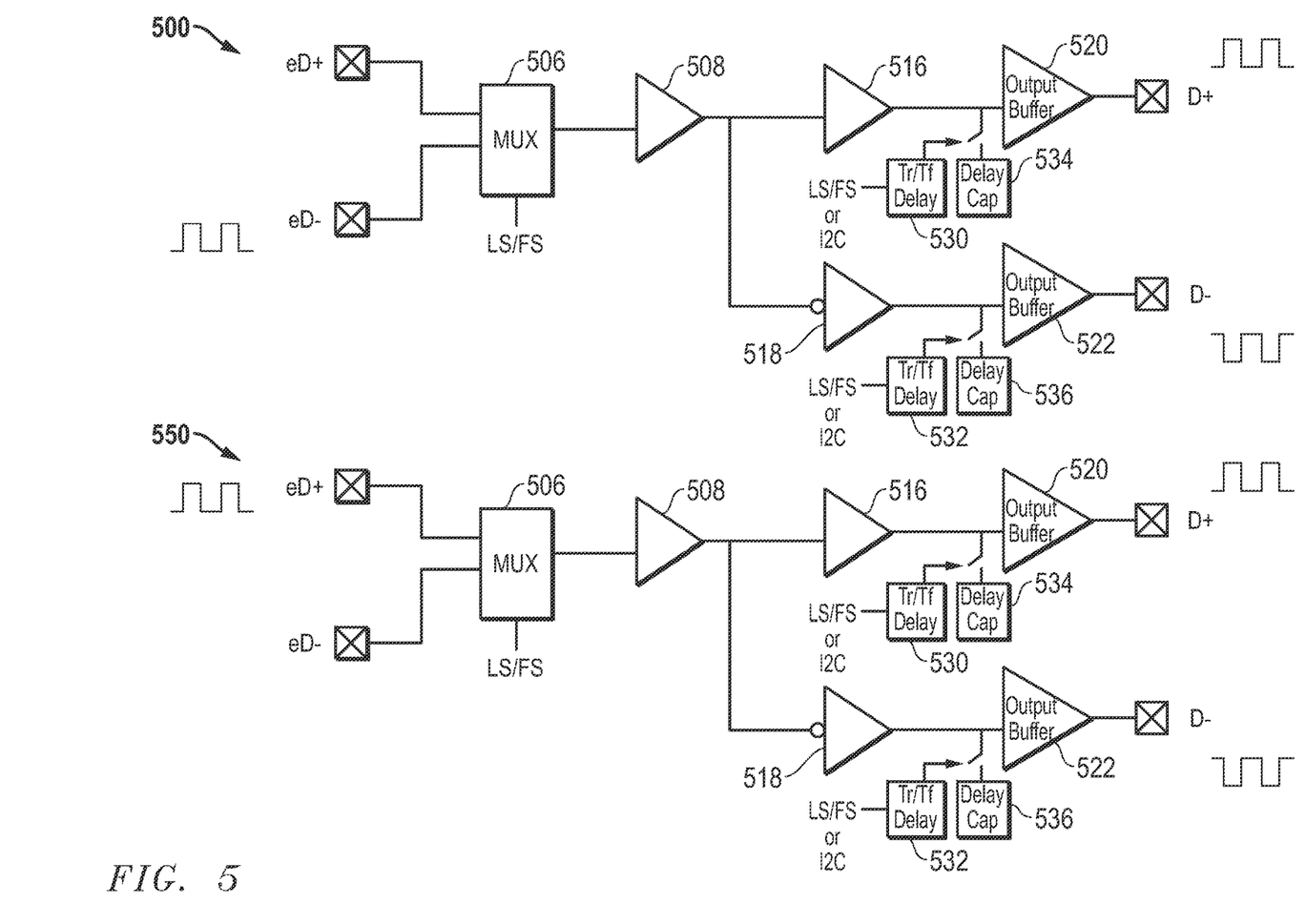
FIG. 5 illustrates in block diagram form a portion of a repeater 500 used in two different signaling modes according to some embodiments.

FIG. 5 illustrates in block diagram form a portion of a repeater 500 used in two different signaling modes according to some embodiments. The same portion of a repeater is shown labelled 550 to illustrate the signal path in LS mode operation. The repeater includes a multiplexer 506, a buffer 508, a buffer 516, and inverter 518, a pair of output buffers 520 and 522, a pair of delay capacitors 534 and 536, and a pair of delay capacitor control circuits 530 and 532 labeled "Tr/Tf Delay" to indicate rise time or fall time delay.

Multiplexer 506 includes two inputs connected to eD+ and eD− terminals of the repeater for receiving signals in eUSB format, and a control input labelled "LS/FS" for receiving a control signal from a digital control circuit such as circuit 208 (FIG. 2). The output of multiplexer 506 is connected to an input of buffer 508, the output of which connects to inputs of both buffer 516 and inverter 518 to create the differential signals fed to output buffers 520 and 522. Multiplexers such as multiplexers 212 and 214 (FIG. 2) are also employed at the output of buffer 516 and inverter 518 for USB protocol negotiation as described above, but are not shown to avoid obscuring the invention. Output buffers 520 and 522 are preferably implemented with ordinary output buffer or driver designs that do not require adjusting their output current in order to change speed modes.

Delay capacitors 534 and 536 are selectively connected to the inputs of output buffers 520 and 522, respectively under control of delay capacitor control circuits 530 and 532. Delay capacitor control circuits 530 and 532 each have an input receiving a control signal labelled "LS/FS or I2C", and an output connected to a switch for activating the delay capacitors 534 and 536, respectively, to connect them between the output terminal and the negative power rail. The signal LS/FS or I2C, in various embodiments, can be implemented as a binary signal indicating whether LS or FS mode is active, or an I2C (Inter-Integrated Circuit) bus connection or another type of control signal connection able to control delay capacitor control circuit 530 and 532 to provide desired values. An I2C bus may be employed, for example, to communicate capacitor values for programmable capacitors.

In operation, delay capacitors 534 and 536 act to tune the crossover by delaying only the rising edge, or only the falling edge of the signal in the D+ or D− path will ensure meeting the cross over specification across wide range of load conditions (50 pF to 600 pF).

In some implementations, for LS and FS modes, different delay settings are selected automatically to meet the crossover spec across different load conditions (50 pF to 600 pF). Preferably, no adjustment is required to the operation of output buffers 520 and 522 to achieve the desired crossover point, which is instead achieved with a change in capacitance provided by delay capacitors 534 and 536.

Figure 6:
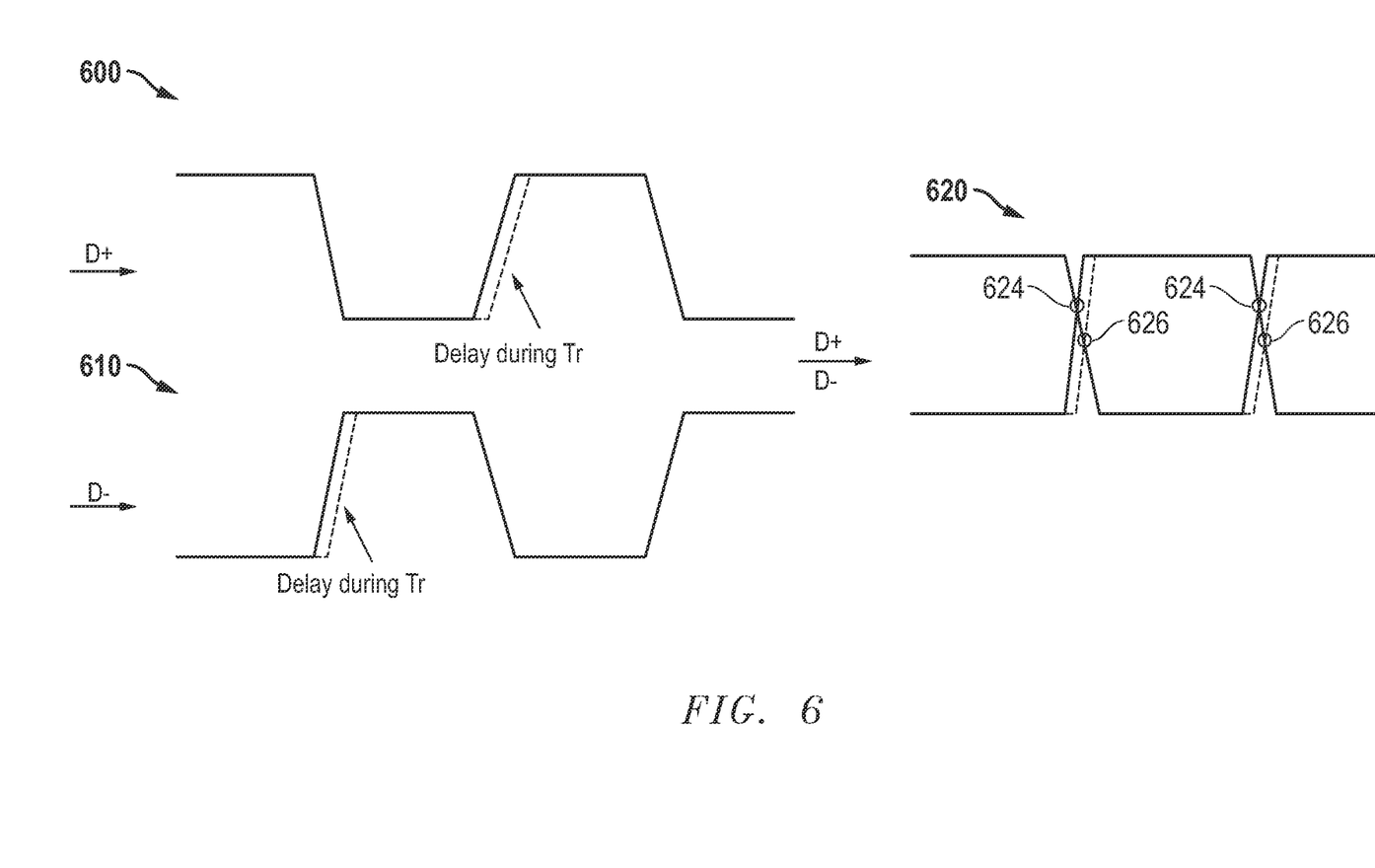
FIG. 6 illustrates in diagram form the effect of applying a delay to meet a crossover point specification according to some embodiments.

FIG. 6 illustrates in diagram form the effect of applying a delay to meet a crossover point specification according to some embodiments. Depicted are a diagram 600 showing a delay applied on a rising edge of the D+ signal, a diagram 610 showing a delay applied to the rising edge of the D− signal, and a diagram 620 showing the effect of the delays on the crossover point of the overall D+/D− differential signal.

A delay, for example one applied by delay capacitors 534 and 546, is labeled "Delay during Tr". In diagram 620, points 624 depict the crossover point in LS mode if no delay is applied. Points 624, under certain load conditions on the D+ and D− terminals, is above the required crossover point of 2V in the USB 2.0 specification, because of the speed of output buffers designed to meet the faster FS mode specifications. Points 626 depict the crossover point when a delay is applied to only the rising edge of the D+ and D− signals. The effect, in this example, is to lower the crossover point back to within the specified range, and more preferably to near the center of the specified range to at or around the typical crossover point of 1.65V (for a 3.3V signaling voltage).

Figure 7:
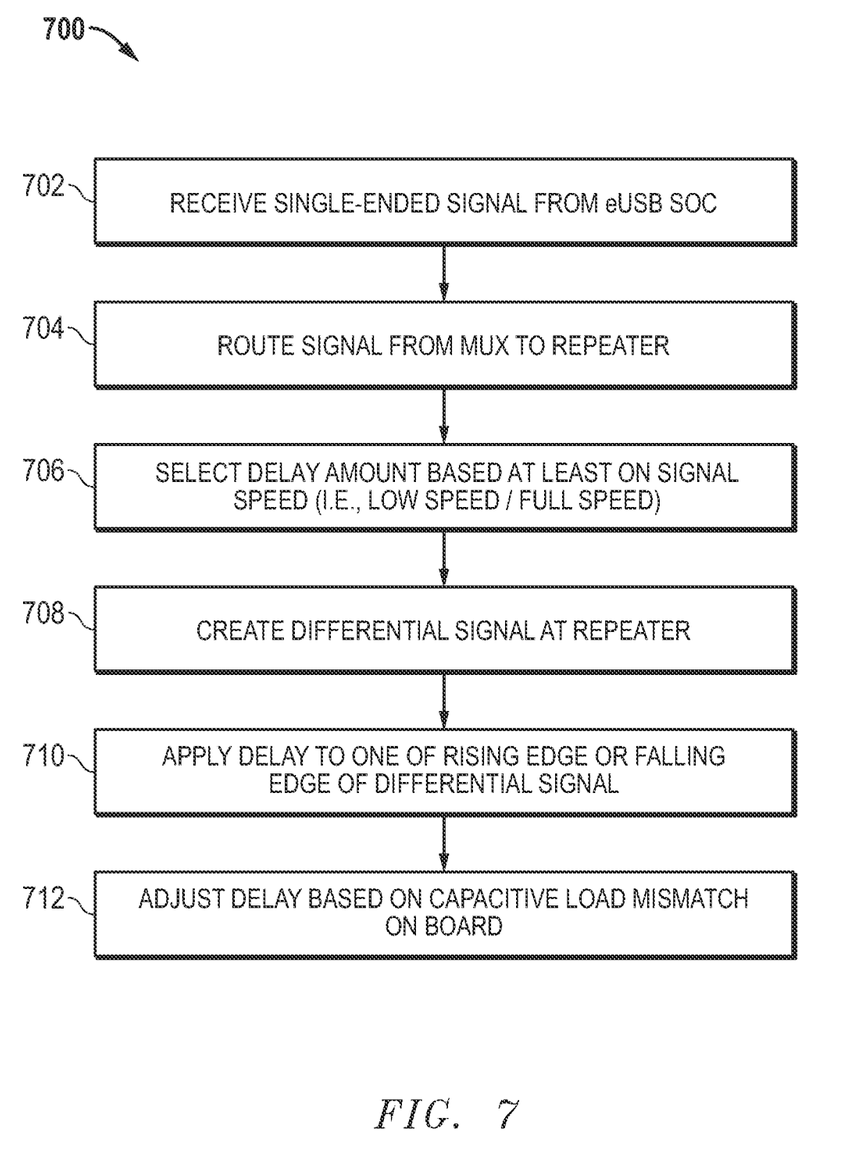
FIG. 7 shows a flowchart of a process for adapting a signal between USB standards according to some embodiments.

FIG. 7 shows a flowchart 700 of a process for adapting a signal between USB standards according to some embodiments. The process is suitable for use with the repeaters shown in FIG. 2, FIG. 3, or FIG. 5, and other suitable repeater designs for adapting single ended to differential signals under load conditions that may vary. While the process is shown as a set of steps, in actual implementations many of the depicted process steps can occur simultaneously.

At block 702, the process receives a single ended signal, in this example from an eUSB SOC. At block 704, the signal is routed from a multiplexer to a driver path of the repeater. In the implementation of FIG. 5, for example, this is done under control of a digital control circuit based on detecting a speed mode setting for the signal, LS or FS.

At block 706, the process selects a delay amount based on the speed mode detected. At block 708, a differential signal is created at the repeater. At block 710, the selected delay is applied to one of, but not both, of the rising edges or the falling edges of the differential signal, as depicted in FIG. 6 for a rising edge delay.

In some embodiments, the delay is adjusted at block 712 to account for a capacitive load mismatch on the board or cabling signal path for the differential signal. The adjustment at block 712 is also able to adjust for mismatches between the D+ and D− sides of the signal path, which is a common problem in USB. For example, a programmable delay capacitor may be used, or a parallel combination of multiple delay capacitors, which are individually controlled to adjust the total delay capacitance individually for each side of the differential signal, producing a different delay on one side the differential signal than that on the other.

Thus, various embodiments of a USB repeater circuit, an apparatus including such a circuit, and a corresponding method have been described. The various embodiments provide for a low-cost yet reliable repeater design for using common output buffers to provide for different signaling rates and still achieve a desired crossover point.

The above-disclosed subject matter is to be considered illustrative, and not restrictive, and the appended claims are intended to cover all such modifications, enhancements, and other embodiments that fall within the true scope of the claims.

Thus, to the maximum extent allowed by law, the scope of the present invention is to be determined by the broadest permissible interpretation of the following claims and their equivalents, and shall not be restricted by the forgoing detailed description.

What is claimed is:

1. A repeater circuit comprising:
    a first input for receiving a single-ended data signal from an embedded universal serial bus (eUSB) host;
    an output for providing a differential data signal in a differential USB format; and
    a repeater coupled between the first input and the output for converting the single-ended data signal to the differential data signal, the repeater comprising an adaptive delay element operable for both sides of the differential data signal to delay one, but not both, of a rising edge and a falling edge of the differential data signal in order to meet a crossover specification for the differential USB format.

2. The repeater circuit of claim 1, wherein the adaptive delay element comprises a programmable capacitor coupled to a first side of the output and a second programmable capacitor coupled to a second side of the differential data signal.

3. The repeater circuit of claim 1, further comprising:
    a second input for receiving a second single-ended data signal from the eUSB host, wherein the first input carries the single-ended data signal when the eUSB host is set to a first speed mode and the second input carries a single-ended data signal when the eUSB host is set to a second speed mode different from the first speed mode;
    a multiplexor that selectively couples one of the first and second inputs to the repeater; and a digital control circuit operable to adjust the adaptive delay element to a different delay value based on whether the first or second input is coupled to the repeater.

4. The repeater circuit of claim 3, wherein the digital control circuit is further operable to adjust the different delay value of the adaptive delay element based on a capacitive load on the output.

5. The repeater circuit of claim 4, wherein the digital control circuit is operable in a first low speed mode to maintain a signal crossover between 1.3 volts and 2 volts across a range of loads from 200 picofarads to 600 picofarads.

6. The repeater circuit of claim 5, wherein the digital control circuit is operable in a second full speed mode to maintain a signal crossover between 1.3 volts and 2 volts at a load value of 50 picofarads.

7. The repeater circuit of claim 1, further comprising a digital control circuit operable to detect an operating speed mode and adjust the adaptive delay element based on the operating speed mode.

8. A processing system comprising:
a processor;
an embedded universal serial bus (eUSB) host coupled to the processor;
a repeater circuit coupled to the eUSB host and including:
a first input for receiving a single-ended data signal from the eUSB host;
an output for providing a differential data signal in a differential USB format; and
a repeater coupled between the first input and the output for converting the single-ended data signal to the differential data signal, the repeater comprising an adaptive delay element operable for both sides of the differential data signal to delay one, but not both, of a rising edge and a falling edge of the differential data signal in order to meet a crossover specification for the differential USB format.

9. The processing system claim 8, wherein the adaptive delay element comprises a programmable capacitor coupled to a first side of the output and a second programmable capacitor coupled to a second side of the differential data signal.

10. The processing system claim 8, wherein the repeater circuit further comprises:
a second input for receiving a second single-ended data signal from the eUSB host, wherein the first input carries the single-ended data signal when the eUSB host is set to a first speed mode and the second input carries a single-ended data signal when the eUSB host is set to a second speed mode different from the first speed mode;
a multiplexor that selectively couples one of the first and second inputs to the repeater; and
a digital control circuit operable to adjust the adaptive delay element to a different delay value based on whether the first or second input is coupled to the repeater.

11. The processing system claim 10, wherein the digital control circuit is further operable to adjust the different delay value of the adaptive delay element based on a capacitive load on the output.

12. The processing system claim 11, wherein the digital control circuit is operable in a first low speed mode to maintain a signal crossover between 1.3 volts and 2 volts across a range of loads from 200 picofarads to 600 picofarads.

13. The processing system claim 12, wherein the digital control circuit is operable in a second full speed mode to maintain a signal crossover between 1.3 volts and 2 volts at a load value of 50 picofarads.

14. The processing system of claim 8, further comprising a digital control circuit operable to detect an operating speed mode and adjust the adaptive delay element based on the operating speed mode.

15. A method comprising:
receiving a single-ended data signal from an embedded universal serial bus (eUSB) host;
providing a differential data signal at an output in a differential USB format; and
applying a delay to one, but not both, of a rising edge and a falling edge of the differential data signal in order to meet a crossover specification for the differential USB format.

16. The method of claim 15, further comprising:
receiving a second single-ended data signal from the eUSB host, wherein a first input carries the single-ended data signal when the eUSB host is set to a first speed mode and a second input carries a single-ended data signal when the eUSB host is set to a second speed mode different from the first speed mode;
selectively coupling one of the first and second inputs to a repeater; and
adjusting an adaptive delay element of the repeater to apply a different delay based on whether the first or second input is coupled to the repeater.

17. The method of claim 16, further comprising:
detecting an operating speed mode; and
adjusting an adaptive delay element of the repeater to apply a different delay based on the operating speed mode.

18. The method of claim 17, further comprising adjusting the delay of the adaptive delay element based on a capacitive load on the output.

19. The method of claim 18, further comprising maintaining a signal crossover between 1.3 volts and 2 volts across a range of loads from 200 picofarads to 600 picofarads.

20. The method of claim 19, further comprising maintaining a signal crossover between 1.3 volts and 2 volts at a load value of 50 picofarads.

* * * * *